US007749053B2

(12) United States Patent
Behns et al.

(10) Patent No.: US 7,749,053 B2
(45) Date of Patent: Jul. 6, 2010

(54) DEVICE FOR GENERATING A NEGATIVE PRESSURE IN THE SEALED ROOM OF A TABLET PRESS AND/OR OF AN ISOLATOR

(75) Inventors: Holger Behns, Barsbuttel (DE); Enrico Gand, Buchen (DE); Linda Heck, Hamburg (DE); Ralf Zingler, Molln (DE)

(73) Assignee: Fette GmbH, Schwarzenbek (DE)

(*) Notice: Subject to any disclaimer, the term of this patent is extended or adjusted under 35 U.S.C. 154(b) by 438 days.

(21) Appl. No.: 11/612,629

(22) Filed: Dec. 19, 2006

(65) Prior Publication Data

US 2007/0149108 A1 Jun. 28, 2007

(30) Foreign Application Priority Data

Dec. 23, 2005 (DE) ....................... 10 2005 061 787

(51) Int. Cl.
*F24F 11/00* (2006.01)
*H05K 5/00* (2006.01)

(52) U.S. Cl. ....................................... 454/238; 454/184

(58) Field of Classification Search ................. 454/184, 454/238; 425/DIG. 60, 60
See application file for complete search history.

(56) References Cited

U.S. PATENT DOCUMENTS

| | | | | |
|---|---|---|---|---|
| 2,710,574 | A * | 6/1955 | Runion | 454/66 |
| 3,103,698 | A * | 9/1963 | Wollett | 53/122 |
| 3,141,792 | A * | 7/1964 | Lachman et al. | 118/697 |
| 3,181,213 | A * | 5/1965 | Schaible et al. | 164/7.1 |
| 3,525,382 | A * | 8/1970 | Devol | 164/155.5 |
| 3,579,217 | A * | 5/1971 | Casey et al. | 340/635 |
| 3,601,086 | A * | 8/1971 | Hostetler | 118/19 |
| 3,677,673 | A * | 7/1972 | Shapiro | 425/78 |
| 4,083,746 | A * | 4/1978 | Thissen | 156/499 |
| 4,133,290 | A * | 1/1979 | Melliger | 118/668 |
| 4,208,177 | A * | 6/1980 | Allen | 425/404 |
| 4,292,017 | A * | 9/1981 | Doepel | 425/107 |
| 4,448,747 | A * | 5/1984 | Moritoki et al. | 419/49 |
| 4,482,515 | A * | 11/1984 | Buhler et al. | 264/102 |
| 4,554,887 | A * | 11/1985 | Yoakam et al. | 118/666 |
| 4,570,229 | A * | 2/1986 | Breen et al. | 700/206 |

(Continued)

FOREIGN PATENT DOCUMENTS

DE 197 00 272 A1 7/1998

(Continued)

*Primary Examiner*—Steve McAllister
*Assistant Examiner*—Helena Kosanovic
(74) *Attorney, Agent, or Firm*—Vidas, Arrett & Steinkraus, P.A.

(57) ABSTRACT

A device for generating a negative pressure in the sealed room of a tablet press and/or of an isolator, with a fan connected to the sealed room and an air opening towards the sealed room, wherein the intake side of an ejector is connected with the sealed room, the working fluid connection of which is connectable with a compressed air source via a valve, with a sensor which is connected to a negative pressure control unit which opens the valve when the sensor measures a pressure in the sealed room which is above a predetermined negative pressure value, a second valve being assigned to the fresh air inlet opening, which depending on the embodiment remains opened or is triggered and closed by the negative pressure control unit.

3 Claims, 1 Drawing Sheet

U.S. PATENT DOCUMENTS

| | | | | | |
|---|---|---|---|---|---|
| 4,576,619 | A | * | 3/1986 | Manning | 96/399 |
| 4,606,868 | A | * | 8/1986 | Christoph et al. | 264/40.4 |
| 4,654,171 | A | * | 3/1987 | Boncoeur et al. | 588/1 |
| 4,817,006 | A | * | 3/1989 | Lewis | 700/206 |
| 4,867,924 | A | * | 9/1989 | Schilkey et al. | 264/101 |
| 4,872,826 | A | * | 10/1989 | Padovani | 425/388 |
| 5,119,311 | A | * | 6/1992 | Gold et al. | 700/206 |
| 5,136,497 | A | * | 8/1992 | Coe et al. | 700/45 |
| 5,517,871 | A | * | 5/1996 | Pento | 73/865.9 |
| 5,626,066 | A | | 5/1997 | Lallement | |
| 5,667,158 | A | * | 9/1997 | Bullock et al. | 241/33 |
| 6,428,410 | B1 | | 8/2002 | Campbell | |
| 6,837,696 | B2 | * | 1/2005 | Sowden et al. | 425/112 |
| 7,140,856 | B2 | * | 11/2006 | Zeddies et al. | 425/78 |
| 7,320,808 | B2 | * | 1/2008 | Banko et al. | 426/231 |
| 7,361,006 | B2 | * | 4/2008 | Sowden et al. | 425/215 |
| 2001/0032396 | A1 | | 10/2001 | Toshima | |

FOREIGN PATENT DOCUMENTS

| | | | |
|---|---|---|---|
| DE | 100 55 751 | A1 | 5/2002 |
| DE | 103 19 448 | A1 | 11/2004 |
| DE | 10 2004 014 773 | A1 | 2/2005 |
| DE | 103 34 937 | A1 | 4/2005 |
| EP | 102 18 220 | C1 | 6/2003 |
| WO | 2005113169 | A1 | 12/2005 |

* cited by examiner

DEVICE FOR GENERATING A NEGATIVE PRESSURE IN THE SEALED ROOM OF A TABLET PRESS AND/OR OF AN ISOLATOR

CROSS-REFERENCE TO RELATED APPLICATIONS

Not applicable.

STATEMENT REGARDING FEDERALLY SPONSORED RESEARCH

Not applicable.

BACKGROUND OF THE INVENTION

With a tablet press, a rotary press is usually meant, with the aid of which not only pharmaceutical pressed articles, but also powder pressed articles for a broad variety of purposes can be produced. Normally, the press unit is located in a casing, which should prevent inevitably generated dust from penetrating into the surrounding room during the pressing process. This is particularly important with a powder material which is toxic in the broadest sense. Due to this, it is known from DE 102 18 220 C2, the entire contents of which is incorporated herein by reference, to seal up the press room sufficiently, so that powder material does not reach the outside In order to improve the sealing action, it is further known to connect a source of negative pressure to the press room, a fan for instance. At the same time, an opening is provided in the press room which permits outer air to flow in. Through this, a negative pressure is constantly generated in the press chamber, on the other hand, dust is sucked off at the same time. A sensor is disposed in the press room for maintaining a minimum negative pressure, the output signal of which is input to a control unit for the negative pressure source, the fan or regulating flaps in the air flow, for instance With toxic products it is known to convey them all together out of a tablet press into a so-called isolator. In the isolator de-dusting, check of the tablets with respect to its content of active ingredient, hardness and other properties takes place for instance, before the tablets are definitively supplied to a packaging container. For isolators is it is also known to generate a negative pressure in the isolator loom, in order to avoid any escape of dust into the surrounding space.

It is also known to positively pressurize a press room of a tabletting machine, with a protective gas for instance, in order to avoid the entrance of impurities into the press room.

Naturally, breakdown of the control for a fan or even of the fan itself can not be prevented with absolute security. It is known to close the sealed room automatically in such a case, thus “enclosing” the negative pressure. When the sealed room is sealed so effectively that the negative pressure decreases only slowly, persons present in the production room have the possibility to leave it in good time With machines having rotating shafts, a leak-out on the shaft sealings takes typically place, which as well as damages on the sealing elements shortens the duration of the decrease of the negative pressure to a not permissible level.

The present invention is based on the objective to provide a device for generating a negative pressure in a sealed room of a tablet press or of an isolator, by which a negative pressure can be made certain when the negative pressure source breaks down, without having to provide a sealing free or short of leak-out in order to maintain the negative pressure for a longer period of time.

BRIEF SUMMARY OF THE INVENTION

In the device according to the present invention, the intake side of an ejector is connected to the sealed room. An ejector is another expression for a jet pump. In the latter, a pumping effect is produced with the aid of a venturi nozzle, as is well known, by supplying a fluid sideways to the venturi nozzle, which produces a propulsive jet. The propulsive jet creates a negative pressure at the beginning of the venturi nozzle, which can be used for pumping purposes. Therefore, when an ejector operated with compressed air is connected to the sealed room, a negative pressure can be maintained with the aid thereof. A negative pressure control unit is connected with the sensor in the sealed room and triggers a valve, which is disposed between the negative pressure source and the operating fluid connection of the ejector. This valve is normally closed, so that the ejector is not in operation. In the contrary, when it is opened, the ejector generates a negative pressure and so it compensates at least partially the breakdown of the fan or the control of the fan, respectively. Preferably, this valve is realised such that it is opened in the not triggered condition, so that the ejector is activated even in the case of failure of the negative pressure control unit.

An additional valve is assigned to the opening towards the sealed room, which is normally opened when the fan is in regular operation.

According to one embodiment of the present invention, this valve is closed upon breakdown of the fan or the fan control, in order to generate the required negative pressure with the ejector with a relatively small consumption of compressed air. However, it is also conceivable to operate the ejector with greater consumption of compressed air at opened valve, in order to further ensure the sucking off of air and dust.

Typically, the injector is operated with compressed air, the use of a liquid being also generally conceivable, however It is conceivable to provide a separate connection on the sealed room for the ejector. However, according to one embodiment of the present invention, it is provided that the intake side of the ejector is connected to the intake duct of the fan, a third valve being disposed between the connection point and the fan and a fourth valve being disposed in the intake duct of the ejector. The third valve takes care that no counter air is aspirated via the fan upon breakdown of the fan and switching on the ejector. The fourth valve is required to close the duct to the ejector when the fan is in operation.

Preferably, according to a further embodiment of the present invention, the third and the fourth valve are fluid actuated. According to another embodiment of the present invention, the actuating appliances of the third and fourth valve are immediately connected to the compressed air duct of the ejector Thus, these valves are actuated automatically in the moment in which the ejector is operated also One example of the realisation of the present invention will be explained in more detail by means of a realisation example represented in a drawing.

DETAILED DESCRIPTION OF THE INVENTION

Figure 1:
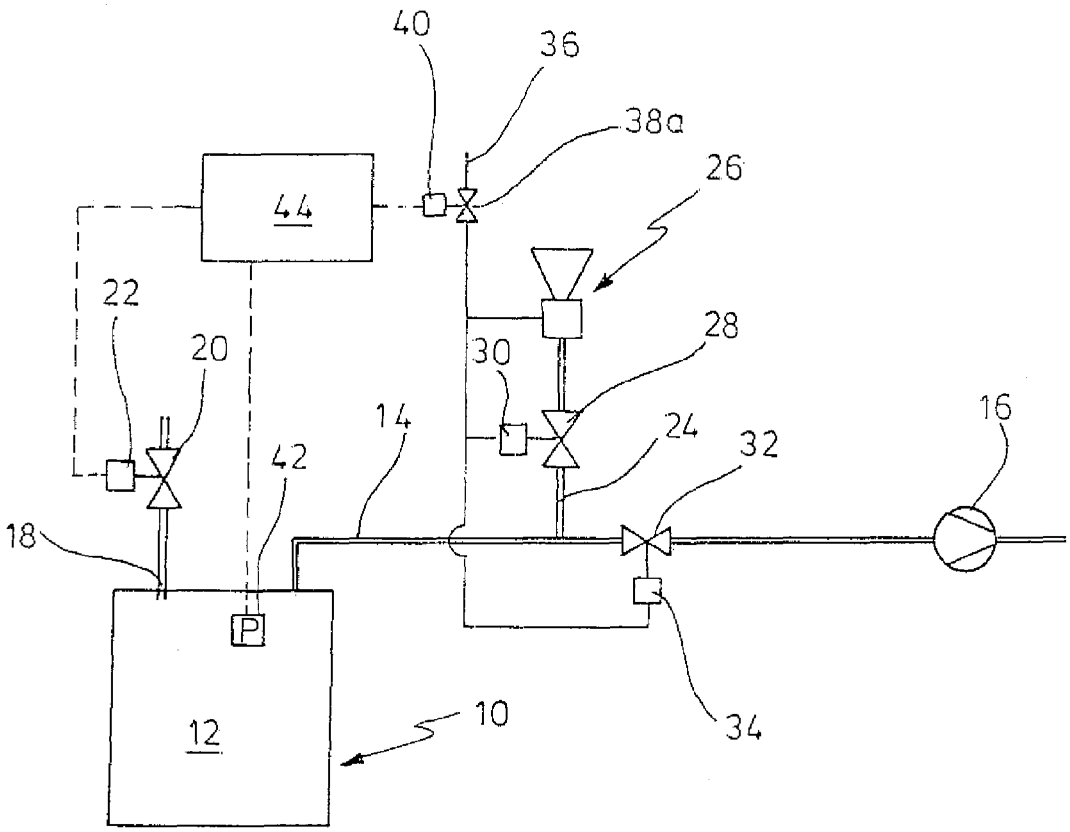
FIG. 1 is a connection diagram of a device according to the present invention.

While this invention may be embodied in many different forms, there are described in detail herein a specific preferred embodiment of the invention This description is an exemplification of the principles of the invention and is not intended to limit the invention to the particular embodiment illustrated In FIG. 1, 10 denotes a rotary tablet press, for instance, or even a so-called isolator, which is assigned to a tablet press The isolator receives the tablets produced by the tablet press via a protected conveying path In the isolator, de-dusting of the tablets, check of the tablets with respect to some parameters and the like take place, for instance In the tablet press 10, there is a press room 12, which is sealed by the casing of the tablet press to a large extent The press room is connected with a duct 14 which leads to a fan 16. The motor-driven fan aspirates air from the sealed room 12 and negatively pressurises it by doing so. Through this, dust is prevented from reaching the surroundings when the tablets are pressed. This is important when the material to be pressed has toxic properties In order to have dust sucked off from the sealed room 12 also, the latter has an opening 18, which is connected to the atmosphere via a valve 20. The valve 20 has an electric actuating appliance 22

A branch duct 24 branches off from the duct 14, which leads to an aspiration end of an ejector 26. On the aspiration side of the ejector 26, a valve 28 is disposed in the duct 24, which is actuated by a pneumatic actuating appliance 30. Between the connection of the branch duct 24 and the fan 16, a valve 32 is disposed, which is actuated by a pneumatic actuating appliance 34

A pressure duct 36 is connected to a not shown pressure source. The same may be a compressed air network in the production facility. Alternatively or additionally, a compressed air reservoir may also be connected with the duct 36. In the duct 36, there is a valve 38*a*, which is actuated by an electric actuating appliance 40.

In the sealed room 12, a pressure sensor 42 is disposed, which is connected to a negative pressure control unit 44.

During the normal production process, the valves 38*a* and 28 are closed and the valves 32 and 20 are opened. A not shown control equipment maintains a certain negative pressure in the sealed room 12 with the aid of the sensor 42. For this purpose, it triggers the fan 16 or the drive motor thereof, respectively, in such a manner that a predetermined negative pressure is maintained, air from the surroundings being charged into the sealed room 12 via the opening 18. When the drive motor for the fan 16 breaks down for certain reasons or the control system of the drive motor suffers a defect, this is detected by the sensor 42 and reported to the negative pressure control unit. As a result, the latter actuates the valves 38*a* and 20 via the assigned electric actuating appliances 40 and 22, so that the valve 20 closes and the valve 38*a* is opened. Through this, a pressure is generated at the actuating appliance 30 of the valve 28 and the actuating appliance 34 of the valve 32. The former valve is opened and the latter one is closed. In addition, the pressure duct 36 is connected to the blowing inlet of the ejector 26, through which a propulsive jet is formed in the ejector, which is constructed in the manner of a venturi nozzle, which generates a negative pressure at the intake entry. This negative pressure is communicated to the sealed room 12. As a consequence, a certain negative pressure can be maintained in the sealed room 12 with the aid of the ejector 26. The period of time in which a negative pressure can be maintained even when the ejector 26 is supplied by a limited pressure reservoir only, is usually sufficient to allow the personnel in the production room to leave it, in order not to be exposed to the toxic substances.

The above disclosure is intended to be illustrative and not exhaustive. This description will suggest many variations and alternatives to one of ordinary skill in this art. All these alternatives and variations are intended to be included within the scope of the claims where the term "comprising" means "including, but not limited to". Those familiar with the art may recognize other equivalents to the specific embodiments described herein which equivalents are also intended to be encompassed by the claims.

Further, the particular features presented in the dependent claims can be combined with each other in other manners within the scope of the invention such that the invention should be recognized as also specifically directed to other embodiments having any other possible combination of the features of the dependent claims. For instance, for purposes of claim publication, any dependent claim which follows should be taken as alternatively written in a multiple dependent form from all prior claims which possess all antecedents referenced in such dependent claim if such multiple dependent format is an accepted format within the jurisdiction (e.g. each claim depending directly from claim 1 should be alternatively taken as depending from all previous claims). In jurisdictions where multiple dependent claim formats are restricted, the following dependent claims should each be also taken as alternatively written in each singly dependent claim format which creates a dependency from a prior antecedent-possessing claim other than the specific claim listed in such dependent claim below.

This completes the description of the preferred and alternate embodiments of the invention. Those skilled in the art may recognize other equivalents to the specific embodiment described herein which equivalents are intended to be encompassed by the claims attached hereto.

What is claimed is:

1. A device for generating a negative pressure in a sealed chamber of a tablet press and/or a tablet isolator, comprising:
- a motor-driven fan connected to the sealed chamber through a first conduit to extract air from the sealed chamber;
- an inlet for the sealed chamber;
- a first valve (20) in the inlet having a control input which is connected to a control unit;
- a pressure sensor within the sealed chamber connected to the control unit;
- a second conduit connected to a pressure source through a second valve (38*a*) which has a control input connected to the control unit;
- a third valve (32) in the first conduit, the third valve having a control input connected to the second conduit;
- an ejector pump with an intake connected to the sealed chamber through a fourth valve (28), and
- the fourth valve having a control input connected to the second conduit, the elector pump having a driving inlet connected to the second conduit, the device working such that if the pressure sensor senses a negative pressure above a predetermined negative value the control unit closes the first valve and opens the second valve so that by pressure in the second conduit the third valve is closed and the fourth valve is opened and the ejector pump can evacuate the sealed chamber.

2. Device according to claim 1, characterised in that the actuating appliances (30, 34) of the valves (28 and 32) are fluid-actuated.

3. Device according to claim 1, characterised in that the valve (38*a*) opens in the not triggered condition and the valve (20) adopts the position provided according to the embodiment, namely either opened or closed, in the not triggered condition.

* * * * *